(12) United States Patent
Raj et al.

(10) Patent No.: US 6,552,951 B1
(45) Date of Patent: Apr. 22, 2003

(54) DUAL-PORT MEMORY LOCATION

(75) Inventors: Kumar Jain Raj, Singapore (SG); Herbert Ehrentraut, Ingolstadt (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/806,299

(22) PCT Filed: Sep. 30, 1999

(86) PCT No.: PCT/DE99/03151

§ 371 (c)(1),
(2), (4) Date: Oct. 3, 2001

(87) PCT Pub. No.: WO00/19437

PCT Pub. Date: Apr. 6, 2000

(30) Foreign Application Priority Data

Sep. 30, 1998 (DE) .......................................... 198 45 053

(51) Int. Cl.$^7$ ................................................. G11C 8/00
(52) U.S. Cl. .................... 365/230.05; 365/102; 365/221
(58) Field of Search ....................... 365/230.05, 230.06, 365/203, 196, 221, 233, 102

(56) References Cited

U.S. PATENT DOCUMENTS

| 5,007,022 | A | | 4/1991 | Leigh |
| 5,010,519 | A | | 4/1991 | Yoshimoto et al. |
| 5,327,375 | A | | 7/1994 | Harari |
| 5,923,593 | A | | 7/1999 | Hsu et al. |
| 6,115,019 | A | * | 9/2000 | Perner .................... 345/205 |
| 6,246,386 | B1 | * | 6/2001 | Perner .................... 345/90 |
| 6,304,478 | B1 | * | 10/2001 | Jain ....................... 365/149 |
| 2002/0006050 | A1 | * | 1/2002 | Jain ....................... 365/104 |

* cited by examiner

*Primary Examiner*—David Nelms
*Assistant Examiner*—Thong Le
(74) *Attorney, Agent, or Firm*—Greenblum & Bernstein, P.L.C.

(57) ABSTRACT

The invention relates to a dual-port DRAM memory location having a capacitor and two transfer gates whose load paths are connected in series. The series connection is arranged between two data transmission lines. This arrangement serves to provide a dual-port memory location which independent of one another, can be read or written by two data processing units. The decisive advantage of the inventive memory locations in a DRAM memory architecture is the size-optimized design. The possibility of providing a memory architecture with substantially reduce space requirements. The inventive memory location is very immune to noise due to its design, due to the small number of switching elements and short length of conductor paths. The small number of transistors and short length of conductor paths also permits to reduce the time required for accessing the data. The invention also relates to a DRAM semiconductor memory having dual-port memory locations.

20 Claims, 2 Drawing Sheets

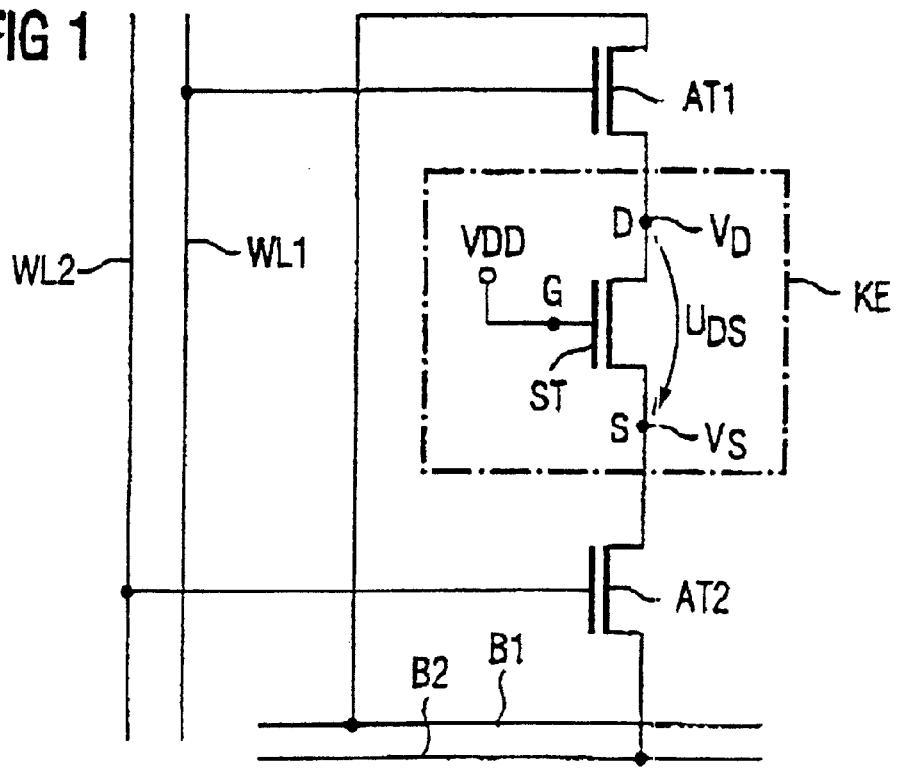
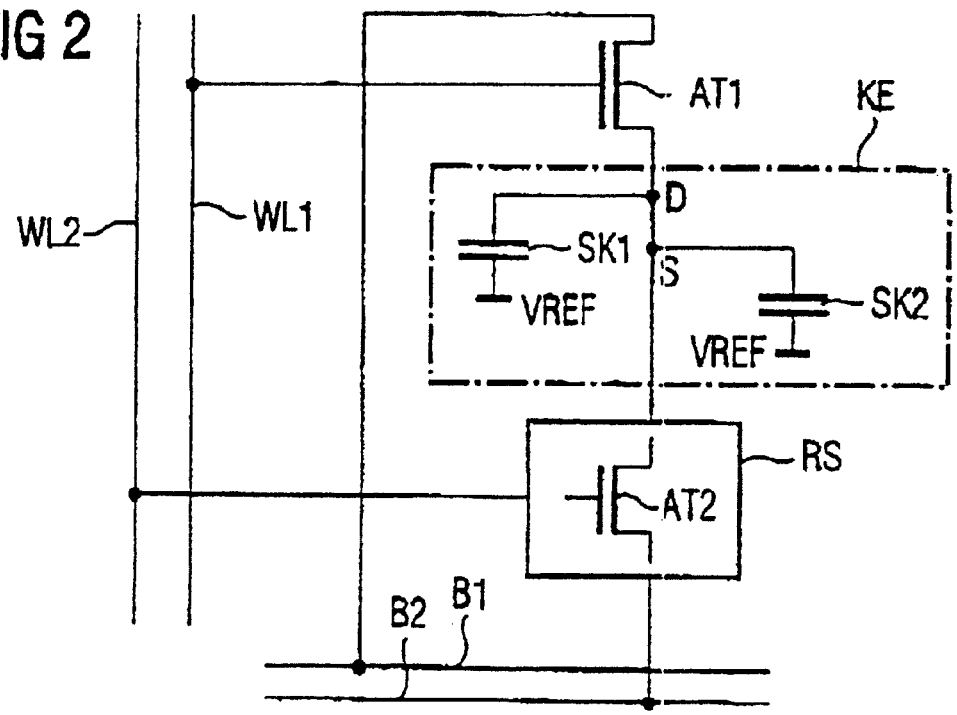

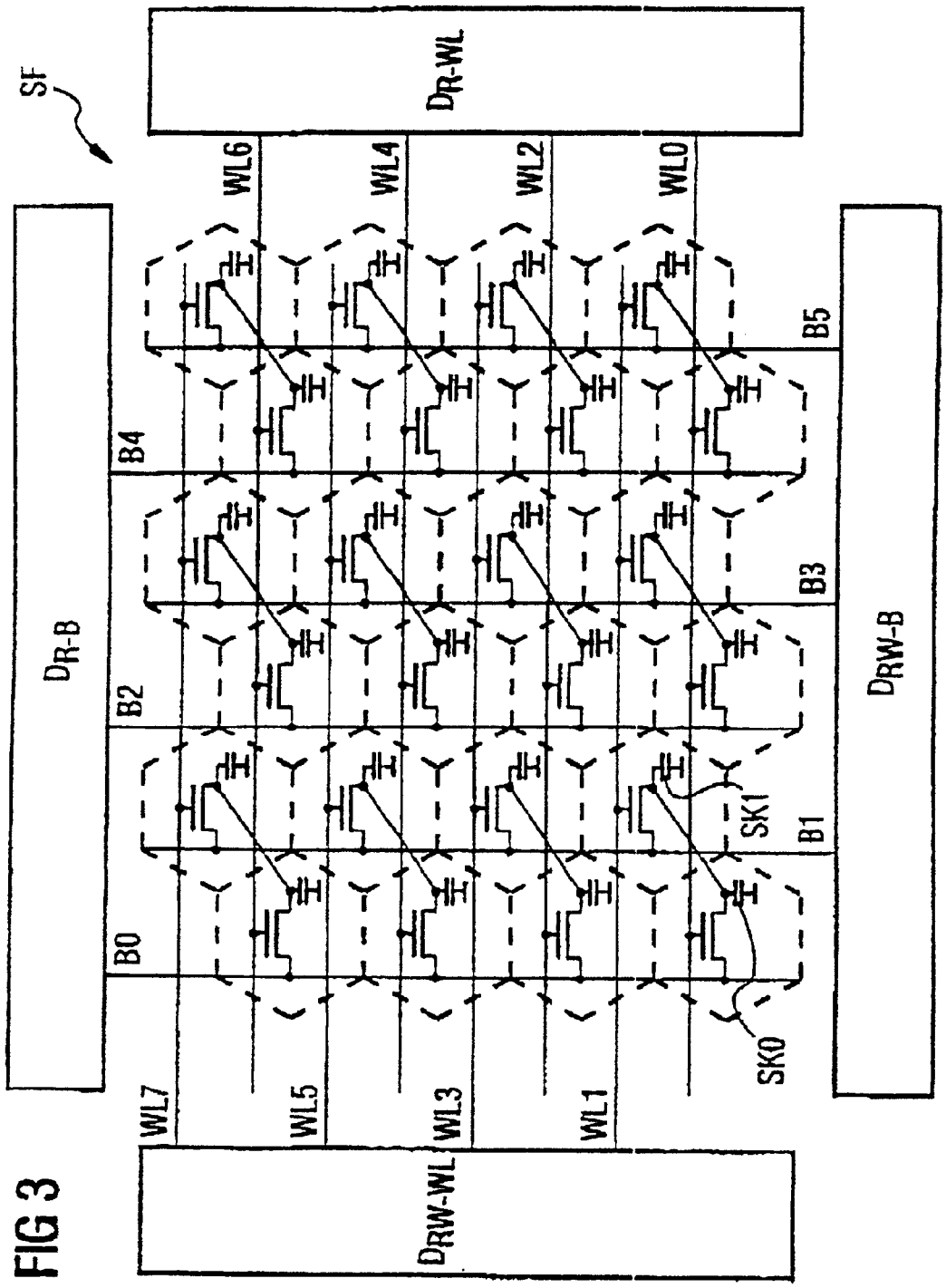

DUAL-PORT MEMORY LOCATION

The invention relates to a dual-port memory cell in accordance with the preamble of claim 1, as disclosed in U.S. Pat. No. 5,010,519 or in U.S. Pat. No. 4,292,677.

The invention likewise relates to a DRAM semiconductor memory having dual-port memory cells.

Dual-port memory cells is a term designating all memory cells which have precisely two data lines, A dual-port memory cell designed as a static memory cell (static random access memory; SRAM) typically contains eight transistors, in each case four selection transistors (transfer gates) and four memory transistors (inverters). These transistors are each connected to two word lines (selection lines) and to two bit lines (data lines). Dynamic dual-port memory cells (dynamic random access memory; DRAM) have not been known heretofore.

Future microelectronic circuits will realize complicated memory architectures with numbers of transistors ranging from $10^{12}$ to $10^{15}$. An elementary boundary condition for economic reasons is undoubtedly ascribed here to the smallest possible area outlay of each of the memory cells on the semiconductor chip. The total number of transistors of an, individual memory cell and the wiring outlay thereof, in which predetermined "design rules" have to be taken into account, essentially determines the size of the memory cell and, consequently, the area outlay of the semiconductor memory constructed from a multiplicity of memory cells of this type.

A further very important boundary condition, which plays a very important part in particular for the semiconductor memory containing the memory cells, results from the requirement of the shortest possible access time to the individual memory cells of the semiconductor memory. Shortening the effective access time is very important in particular in the case of the fundamentally very slow dynamic memories (DRAMs), access time to the individual memory cells of the semiconductor memory. Shortening the effective access time is very important in particular in the case of the fundamentally very slow dynamic memories (DRAMs), in order not to give rise to an excessively large difference with regard to the clock rates of the processors used as standard nowadays. The access time in a semiconductor memory essentially results from the propagation time of the data signals on the word lines and from the charge reversal of the storage capacitances. However, since the effective interconnect length increases by about 40% in the case of a semiconductor memory transition from one-port memory cells to two-port memory cells, the undesirable result is a corresponding increase in the signal propagation times and, consequently, an increase in the access times. This causes additional parasitic capacitances and resistances in the word lines and data lines, and because of these the signal change times and, consequently, the access times to the individual memory cells are considerably prolonged.

The present invention is therefore based on the object of specifying a dynamic dual-port memory cell with a space-sating design.

According to the invention, this object is achieved by means of a dual-port memory cell having the features of patent claim 1.

In the preferred configuration, the dual-port memory cell according to the invention in each case has a capacitive element designed as a memory transistor and two selection transistors, whose load paths are connected in series and this series circuit is arranged between two data lines. This arrangement makes it possible for a dual-port memory cell to be read from and written to in parallel by two date processing units.

It would also be conceivable, of course, to realize the capacitive element as two capacitors which are short-circuited together and are in each case arranged between the center tap of the selection transistors and a reference-ground potential. DRAM memory cells, in particular on account of their comparatively small capacitances and short respective line lengths, are particularly advantageous in dynamic semiconductor memories since here the corresponding memory cells can be given very small dimensions.

The decisive advantage of the dual-port memory cells according to the invention in a DRAM memory architecture resides, as already mentioned, in an area-optimized design, that is to say in the possibility of providing a memory architecture having a distinctly reduced area outlay. In particular when the capacitive a element is designed as a CMOS transistor, each of the load path terminals of the CMOS transistor can be short-circuited with a respective load path terminal of the selection transistors. It is particularly advantageous here when the terminal nodes of the CMOS transistors coincide with the terminal nodes of the selection transistors. By virtue of this saving of area-intensive terminal nodes, the dual-port memory cell according to the invention manages with a very small area requirement, as a result of which dual-port DRAM memory cells can thus be fabricated particularly cost-effectively. However, the saving of terminal nodes can also advantageously be realized with capacitive elements designed as capacitors.

In the memory cell according to the invention, both output paths of the capacitive element have a defined potential of approximately the same magnitude.

Functionality of this type has not been able to be ensured hitherto in conventional DRAM memory cells since here a respective terminal of the capacitive element always "floats", i.e. is at an undefined potential. DRAM memory cells have therefore had to be recharged at regular intervals (refresh operation). During this refresh operation, it has not been possible to read from or write to the DRAM memory cell, as a result of which undefined switching states can never be completely avoided. Therefore, this abovementioned functionality has been achievable hitherto only by SRAM memory cells. The dual-port DRAM memory cell according to the invention makes it possible to combine the above-described advantages of a DRAM memory cell, i.e. shorter access time, area optimization, etc., with the functionality of an SRAM memory cell with regard to the defined switching states thereof.

On account of its design, i.e. on account of the small number of circuit elements and short interconnect lengths, the memory cell according to the invention is, moreover, highly insensitive to noise. The memory cell therefore exhibits a distinctly improved signal-to-noise ratio (SNR) in comparison with convention dual-port memory cells.

The smaller number of transistors and the short effective interconnect lengths additionally bring about very short access times. Moreover, the access time is additionally improved on account of in the reduced parasitic capacitances and resistances in the critical line path. As a result, it is possible to provide memory systems which have a higher performance for the same clock frequency.

In particular, the invention is particularly advantageously suitable for "multi-port semiconductor memories" having a multiplicity of dual-port DRAM memory cells according to the invention.

The subclaims are directed as preferred configurations and developments of the invention.

The invention is explained in more detail below using the exemplary embodiments specified in the figures of the drawing, in which:

FIG. 1 shows the circuit diagram of a first exemplary embodiment of a dual-port memory cell according to the invention;

FIG. 2 shows the circuit diagram of a second exemplary embodiment of a dual-port memory cell according to the invention;

FIG. 3 shows an advantageous exemplary embodiment of a DRAM semiconductor memory having dual-port memory cells according to the invention.

In all the figures of the drawing, identical or functionally identical elements are provided with the same reference symbols, unless specified otherwise. Hereinafter, unless specified otherwise, all dual-port DRAM memory cells are designated as memory cells for short.

FIG. 1 shows the circuit diagram of a first exemplary embodiment of a dual-port DRAM memory cell DPS according to the invention. The memory cell DPS has two selection transistors AT1, AT2 and also a capacitive element KE. In FIG. 1, the capacitive element KE is designed as a CMOS memory transistor ST, whose gate terminal G is connected to a supply potential VDD. The drain terminal D of the memory transistor ST is connected to a first data line B1 via the load path of the first selection transistor AT1. The source terminal S of the memory transistor ST is connected to a second data line B2 via the load path of the second selection transistor AT2. The load paths of the selection transistors AT1, AT2 and of the memory transistor ST are thus connected in series and arranged between the first data line B1 and the second data line B2. The control terminals of the selection transistors AT1, AT2 are connected to a respective word line WL1, WL2. By means of a selection signal on the word lines WL1, WL2, the corresponding selection transistors AT1, AT2 are isolated and can be driven independently.

The memory cell DPS is connected via the data lines B1, B2 to two data processing units connected downstream. These data processing units may be designed for example as a microcomputer, processor, logic circuit, bus, etc. Typically, but not necessarily, the data processing units are operated with different clock frequencies. Data can be written to and read from the, memory cell DPS, i.e. the memory transistor ST, bidirectionally and independently of one another via the data lines B1, B2. The corresponding selection transistors AT1, AT2 car be controlled into the on state and into an off state via the word lines WL1, WL2.

FIG. 2 shows the circuit diagram of a second exemplary embodiment of a dual-port memory cell according to the invention. In the memory cell DPS in FIG. 2, the capacitive element KE has been realized by means of two storage capacitors SK1, SK2 arranged in parallel. The storage capacitors SK1, SK2 are designed as DRAM capacitors whose first capacitor terminals (capacitor plates) are in each case connected to one another and in each case to a load path terminal of the selection transistors AT1, AT2. A supply potential VREF is applied to the respective second capacitor terminals (in a "floating" manner). It is particularly advantageous if the first capacitor terminals coincide with the respective load path terminals of the assigned selection transistors AT1, AT2 in order to ensure an area-optimized design.

In addition, a logic circuit or a state machine may be provided, which regularly recharges the stored data content of the memory cell DPS. Such a logic circuit or state machine is referred to as a refresh circuit RS in the technical jargon. In the present exemplary embodiment, this refresh circuit RS contains the second selection transistor AT2. In the present exemplary embodiment, such a refresh circuit RS is provided only between the positive element KE and the second data line B2. It would also be conceivable, of course, additionally or alternatively to provide a (further) refresh circuit between the first data line B1 and the capacitive element KE.

The refresh circuit RS can be formed by two sense amplifiers and a precharge circuit in a known manner. These two sense amplifiers and the precharge circuit could be part of the bit line decoder of the semiconductor memory.

It is particularly advantageous if an "autorefresh circuit" RS is provided, in the case of which the recharging of the memory cell DPS is automated. The individual addresses of the different memory cells can be continually generated in ascending or descending order by means of a simple clocked ring counter, which memory cells are then recharged in the corresponding time intervals by the precharge circuit or by a reference voltage source.

FIG. 3 uses a simplified circuit diagram to show an advantageous exemplary embodiment of a DRAM semiconductor memory having dual-port memory cells according to the invention.

In a conventional DRAM memory cell, a selection transistor is in each case connected to a storage capacitor. The particular advantage in the case of the memory cell according to the invention is that in each case two capacitors of the memory array SF, for example SK0, SK1, are internally short-circuited together. This produces dual-port memory cells DPS in a dual-port DRAM semiconductor memory. The two ports are totally independent of one another in this case. It is particularly advantageous if the two ports are separated into a read/write port and a refresh port, which is only responsible for the refresh or recharging of the memory array SF. In this case, the decoders for the read/write ports $D_{RW-B}$, $D_{RW-WL}$ may be connected to the odd-numbered data/selection lines, while the decoders for the refresh ports $D_{R-B}$, $D_{R-WL}$ may be connected to the even-numbered data/selection lines.

Although the storage density in a dual-port DRAM semiconductor memory configured in this way is thereby halved in comparison with a conventional semiconductor memory, it is nonetheless still a factor of 20 higher than in a conventional SRAM semiconductor memory. A dual-port DRAM semiconductor memory according to the invention which is configured in this way can even replace a medium-sized conventional SRAM semiconductor memory on a chip with embedded DRAM memory cells. In all these applications, both the significantly higher storage density of a semiconductor memory configured as a DRAM in comparison with a 6-transistor memory cell of an SRAM semiconductor memory and the associated lower power loss are particularly advantageous.

The method of operation of the dual-port memory cell DPS according to the invention is briefly described below with reference to FIG. 1:

During a write operation via the first data line D1, the first selection transistor AT1 is controlled into the on state. The capacitive element K is thereby charged with the potential VDD–Vth if a digital "1" is to be written to the corresponding memory cell DPS, or is discharged to the potential VSS if, for example, a digital "0" is to be written to the corresponding memory cell DPS.

The invention exploits the fact that, for approximately identical potentials at the gate terminal and source terminal of the memory transistor ST, the voltage drop UDS between source and drain terminals is equivalent to the threshold voltage Vth thereof. Since the gate terminal of the memory transistor ST is connected to the supply potential VDD, however, the source terminal and drain terminal of the memory transistor ST have the same potential, i.e. VS=VD=VDD−Vth for a digital "1" and VS=VD=VSS for a digital "0". Since the drain potential VD and the source potential VS are thus at the same potential, each of the data processing units can access the information stored in the memory transistor ST without a reduction in the voltage in the memory cell DPS.

Typically, in a dual-port memory cell DPS, at most one of the connected data processing units should be write-authorized during a write operation. A simple logic circuit can be used to prevent the respective other data processing unit from being able to write simultaneously to the same memory cell DPS, Conversely, it is advantageously possible, however, that both data processing units connected to the dual-port memory cell can read data from this memory cell DPS.

The invention is particularly suitable in the case of memory cells fabricated using CMOS technology. However, the memory, cells are not restricted to a specific transistor technology, but rather can be realized by any type of field-effect-controlled, normally on or normally off transistors, typically fabricated using MOS technology. However, memory cells of bipolar design would also be conceivable.

In a development, it is possible, of course, to employ all known measures according to the prior art for area optimization and for shortening the access time, for example by optimizing the design rules, in order to develop the dual-port DRAM memory cell DPS according to the invention and thus the corresponding semiconductor memory constructed from a multiplicity of such memory cells.

FIG. 3 shows an advantageous exemplary embodiment of a dual-port semiconductor memory having dual-port memory cells according to the invention.

What is claimed is:

1. A dual-port memory cell, comprising:
(a) a first selection transistor and a second selection transistor,
(a1) whose load paths are arranged in series and between a first and a second data line; and
(a2) whose control terminals are respectively connected to a first and a second word line, it being possible for the selection transistors to be driven independently of one another via their control terminals; and
(b) a capacitive element,
(b1) which has a first output terminal, which is connected to a load path terminal of the first selection transistor and a second output terminal, which is different from the first output terminal and which is connected to a load path terminal of the second selection transistor;
(b2) approximately the same potential being present at the output terminals,
wherein the capacitive element is designed as a memory transistor, whose load path is arranged between the series-connected load paths of the selection transistors and which can be controlled via a control terminal, to which a supply potential is applied, a voltage across the load path of the memory transistor corresponding to a turn-on voltage thereof, the first output terminal and the second output terminal of the capacitive element being directly connected to a respective load path terminal of the first selection transistor and the second selection transistor.

2. The dual-port memory cell as claimed in claim 1, wherein the capacitive element or the memory transistor is designed as a CMOS transistor.

3. The dual-port memory cell as claimed in claim 1, wherein the capacitive element of the dual-port memory cell can be both written to and read from via the first and/or via the second selection transistor independently of one another.

4. The dual-port memory cell as claimed in claim 1, wherein at least one charging device is provided, which recharges the capacitance of the capacitive element in each case via at least one of the selection transistors.

5. The dual-port memory cell as claimed in claim 4, wherein one of the selection transistors is part of the charging device.

6. The dual-port memory cell as claimed in claim 4, wherein the charging device is part of a bit line decoder which has at least a sense amplifier and a precharge circuit, and in that the charging device has a clocked ring counter which, via its counter reading, generates an address for a respective memory cell at regular time intervals and via which the charging device automatically recharges the capacitance of the capacitive element.

7. The dual-port memory cell as claimed in claim 1, wherein the data lines are each operated with a different clock frequency.

8. A DRAM semiconductor memory having a multiplicity of dual-port memory cells as claimed in claim 1.

9. The dual-port memory cell as claimed in claim 2, wherein the capacitive element of the dual-port memory cell can be both written to and read from via the first and/or via the second selection transistor independently of one another.

10. The dual-port memory cell as claimed in claim 2, wherein at least one charging device is provided, which recharges the capacitance of the capacitive element in each case via at least one of the selection transistors.

11. The dual-port memory cell as claimed in claim 3, wherein at least one charging device is provided, which recharges the capacitance of the capacitive element in each case via at least one of the selection transistors.

12. The dual-port memory cell as claimed in claim 11, wherein one of the selection transistors is part of the charging device.

13. The dual-port memory cell as claimed in claim 5, wherein the charging device is part of a bit line decoder which has at least a sense amplifier and a precharge circuit, and in that the charging device has a clocked ring counter which, via its counter reading, generates an address for a respective memory cell at regular time intervals and via which the charging device automatically recharges the capacitance of the capacitive element.

14. The dual-port memory cell as claimed in claim 2, wherein the data lines are each operated with a different clock frequency.

15. The dual-port memory cell as claimed in claim 3, wherein the data lines are each operated with a different clock frequency.

16. The dual-port memory cell as claimed in claim 4, wherein the data lines are each operated with a different clock frequency.

17. A DRAM semiconductor memory having a multiplicity of dual-port memory cells as claimed in claim 2.

18. A DRAM semiconductor memory having a multiplicity of dual-port memory cells as claimed in claim 3.

19. A DRAM semiconductor memory having a multiplicity of dual-port memory cells as claimed in claim 4.

20. A DRAM semiconductor memory having a multiplicity of dual-port memory cells as claimed in claim 5.

* * * * *